United States Patent

[11] 3,591,838

[72] Inventors Shohei Fujiwara
Takatsuki-shi;
Gota Kano, Kyoto; Shunsuke Matsuoka, Takatsuki-shi; Tsukasa Sawaki, Toyonaka-shi, all of, Japan

[21] Appl. No. 786,005
[22] Filed Dec. 23, 1968
[45] Patented July 6, 1971
[73] Assignee Matsushita Electronics Corporation
Osaka, Japan
[32] Priority Dec. 28, 1967
[33] Japan
[31] No 43/4

[54] SEMICONDUCTOR DEVICE HAVING AN ALLOY ELECTRODE AND ITS MANUFACTURING METHOD
6 Claims, 5 Drawing Figs.

[52] U.S. Cl. .......... 317/234 R, 317/234 L, 317/235 R, 29/589
[51] Int. Cl. .......... H01l 3/00
[50] Field of Search .......... 317/234; 29/589, 590, 591, 587—591; 117/107, 227

[56] References Cited
UNITED STATES PATENTS

| | | | |
|---|---|---|---|
| 3,270,256 | 8/1966 | Mills | 317/234 |
| 3,324,357 | 6/1967 | Hill | 317/234 |
| 3,432,913 | 3/1969 | Bronnes et al. | 29/472.7 |
| 3,243,324 | 3/1966 | Kodera et al. | 148/177 |

*Primary Examiner*—John W. Huckert
*Assistant Examiner*—B. Estrin
*Attorney*—Stevens, Davis, Miller and Mosher

ABSTRACT: In a semiconductor device a metal electrode film formed by an evaporated gold-chromium alloy containing 3 percent to 13 percent by weight of chromium can not only make low ohmic contact with the semiconductor substrate but can be connected to it mechanically firmly. The lead-tin eutectic alloy can be soldered satisfactorily to the metal electrode film without causing erosion even if the electrode film is dipped in a fused solder solution. The semiconductor device with such a gold-chromium alloy film has great industrial merit since the manufacturing steps, particularly the connection of external electrode lead wires, are greatly simplified.

SEMICONDUCTOR DEVICE HAVING AN ALLOY ELECTRODE AND ITS MANUFACTURING METHOD

This invention relates to a semiconductor device made of silicon, germanium, etc. and more particularly to a metal electrode film provided on the surface of the semiconductor device and a method for manufacturing such a metal electrode film.

Conventional methods for obtaining electrically good contact films for a silicon semiconductor device are vacuum evaporation of aluminum gold etc. and electroless or electrolytic plating of a nickel film. The nickel film is commonly used as an electrode metal film because conducting wires can be soldered to it. However, the plating of nickel film is usually very difficult to apply to the high resistive silicon. The force of adhesion between the nickel film and the silicon semiconductor substrate is weak, and, furthermore, in the case of P-type silicon the contact resistance becomes high. For such reasons the use of nickel film has been restricted.

In order to reduce the contact resistance an aluminum film is used for evaporation on the silicon substrate. By heat treatment the silicon substrate is a alloyed to aluminum thereby to increase the impurity concentration on the silicon surface. Next, the aluminum film is removed and nickel plating is applied. But the process becomes very complicated. Moreover, since an oxide film is spontaneously formed on the surface of a nickel film during the later steps or preservation, special flux is needed in soldering. The flux should be completely removed after soldering.

A gold evaporation film is excellent in view of electric conductivity. It forms eutectic alloy with silicon by a relatively low temperature heat treatment. As a result, a good nonrectifying contact is formed. Therefore, the use of a gold evaporation film is another method widely used for forming a metal electrode. However, while the gold film can be well adhered to the conventional soft solder mainly made of lead, tin, indium, zinc and cadmium, it is readily alloyed therewith. A gold film of the order of 1,000 A. thickness is fused in the solder and vanishes, making the electric connection impossible.

A chromium film evaporated on the oxide, metal, and semiconductor surfaces adheres very strongly, but the soft solder adheres to chromium only slightly as fusing of chromium scarcely occurs. Soldering to a chromium film is very difficult.

A double layer of chromium and gold, i.e. a genuine chromium film deposited on silicon plus a genuine gold film stacked on the chromium film, and another structure in which chromium and gold are more or less mixed and alloyed near the boundary of the double layer are proposed as the electrode film on silicon satisfying the desired objects. However, the genuine chromium film suppresses the diffusion of gold in silicon during the evaporation step or the subsequent heat treatment so that the contact resistance can not be reduced. In the case of the above double layer film if silicon has an impurity concentration of more than $10^{17}$ cm.$^{13}$ the contact resistance of the chromium film is low enough to avoid practical troubles. However, it is extremely difficult to remove the chromium film completely by the usual etching solution when a minute pattern is to be formed on the film by the photolithographic process.

Therefore, a first object of this invention is to provide a metal electrode film of a semiconductor device making good ohmic contact (low resistivity contact) with the semiconductor substrate while being capable of being soldered.

A second object of this invention is to provide an easy manufacturing method of such a metal electrode film for a semiconductor device.

A third object of this invention is to simplify the manufacturing process of the semiconductor device and make the manufacture easy.

Other objects, features and advantages of the present invention will be readily apparent from the following detailed description taken in conjunction with the accompanying drawings, in which.

Figure 1:
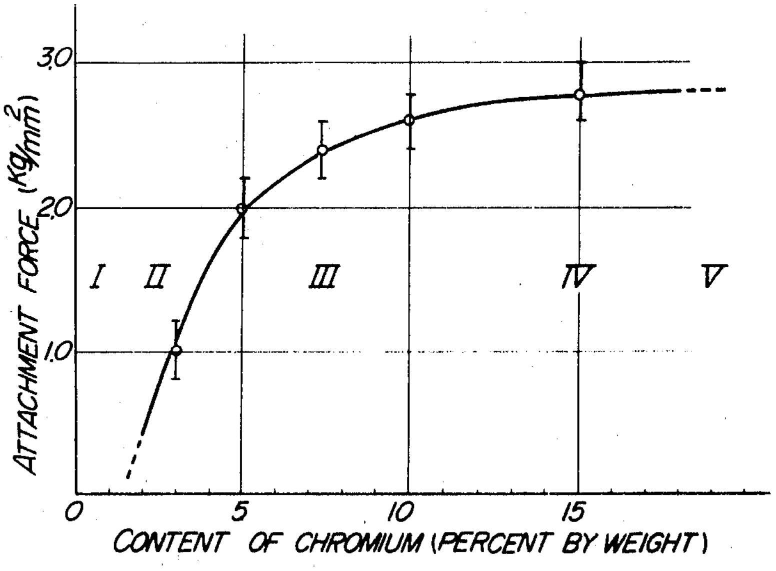
FIGS. 1 and 2 show the force of adhesion between the silicon oxide film and the electrode film obtained by this invention in terms of the chromium content in the gold-chromium alloy and the temperature of the silicon oxide film respectively.

According to this invention a gold-chromium alloy film containing a suitable amount of chromium, i.e. 3 percent to 13 percent by weight of chromium, is deposited on a semiconductor substrate thereby to provide on a semiconductor device an electrode film having a strong force of adhesion and capable of being easily soldered. This semiconductor device can be obtained by a much more simplified process than the conventional ones, and contributes to decrease the manufacturing cost. The present invention eliminates the defects of the chromium film and the gold film of the prior electrode film structure by the evaporation of a gold-chromium alloy film and provides an electrode film having a low contact resistance and capable of being soldered to the semiconductor device.

The inventors' experiments have proved that evaporation of the gold-chromium alloy film may be done by well-known methods, i.e. either evaporating gold and chromium from two evaporation sources simultaneously in vacuum, or evaporating preformed gold-chromium alloy from a single evaporation source. In the case of the former simultaneous evaporation, used to control the composition of the evaporated alloy film, the evaporation speeds of gold and chromium should be accurately measured or simultaneously controlled considering the relative position of the sources. So, the industrial manufacturing steps of the semiconductor device become rather complex.

In contrast to this, the latter method, i.e., the evaporation of the preformed alloy with prescribed composition from one source, is simpler, particularly in the case of a gold-chromium alloy, and easily applied to mass production. The reason for this is the small variation in composition during the evaporation step. As is well known, the following relation holds when the alloy consisting of two kinds of metal A and B having the evaporation speeds $E_A$ and $E_B$ respectively is evaporated from one source.

$$\frac{E_A}{E_B}=\frac{N_A}{N_B}\cdot\frac{P_A}{P_B}\cdot\sqrt{\frac{M_B}{M_A}}$$

where $N_A$ and $N_B$ are percentages by weight, $P_A$ and $P_B$ are the saturated vapor pressures corresponding to the temperature of evaporation sources, and $M_A$ and $M_B$ are atomic weights of each metal A and B respectively. The evaporation speed ratio of each metal component in the gold-chromium alloy can be calculated theoretically referring to the data given by R. E. Konig, RCA Review, vol. 23, p. 567 (1962) as shown in the following table.

| | 1,200° C. | | 1,400° C. | | 1,600° C. | | 1,800° C. | |
|---|---|---|---|---|---|---|---|---|
| Metal | P (mm. Hg) | $P\sqrt{M}$ | P (mm. Hg) | $P\sqrt{M}$ | P (mm. Hg) | $P\sqrt{M}$ | P (mm. Hg) | $P\sqrt{M}$ |
| A=Cr | $2.6\times10^{-4}$ | $3.6\times10^{-5}$ | $1.1\times10^{-2}$ | $1.5\times10^{-3}$ | $1.9\times10^{-1}$ | $2.6\times10^{-2}$ | $2.0\times10^{0}$ | $2.8\times10^{-1}$ |
| B=Au | $4.0\times10^{-4}$ | $2.8\times10^{-5}$ | $1.1\times10^{-2}$ | $7.6\times10^{-4}$ | $1.5\times10^{-1}$ | $1.0\times10^{-2}$ | $1.3\times10^{0}$ | $9.2\times10^{-2}$ |
| EA/EB | 1.3×NA/NB | | 2.0×NA/NB | | 2.6×NA/NB | | 3.0×NA/NB | |

Considering the allowable composition change in the direction of film thickness it is practical to evaporate prescribed amount of alloy with prescribed composition from a single evaporation source. The temperature of the evaporation source is desirably from 1300° to 1600° C.

Next detailed experimental results of a silicon semiconductor device in which the gold-chromium alloy film is used as an electrode film will be explained hereinafter in conjunction with the influence of the alloy composition on the force of adhesion of the electrode film, the relative difficulty of soldering and photolithography, and the contact resistance. In this experiment, a prescribed amount of gold-chromium alloy is evaporated from one evaporation source. The gold-chromium alloy is obtained by sealing chromium and gold at a prescribed weight ratio in a transparent quartz tube in vacuum and heating them at such a temperature that each component is fused completely. After deposition the gold-chromium alloy film is evaporated on the substrate through a mask having an aperture of a prescribed area (1.0 mm. diameter) and dipped in the fused solution of lead-tin eutectic solder. A thin copper wire is soldered to the deposited tin solder and then the value of the pull at which the film is peeled off is measured. FIG. 1 shows the relation between the composition and the mean force of adhesion of the gold-chromium film evaporated on a silicon oxide film which is grown on the surface of a thick silicon slice. The temperature of the substrate during the deposition is 200° C. and the thickness of the gold-chromium film is 4,000 A. It is clear that with an increase of chromium content the force of adhesion of the film increases. The regions from I to V distinguish the states of adhesion between the film and the solder, as will be explained later in more detail.

Figure 2:
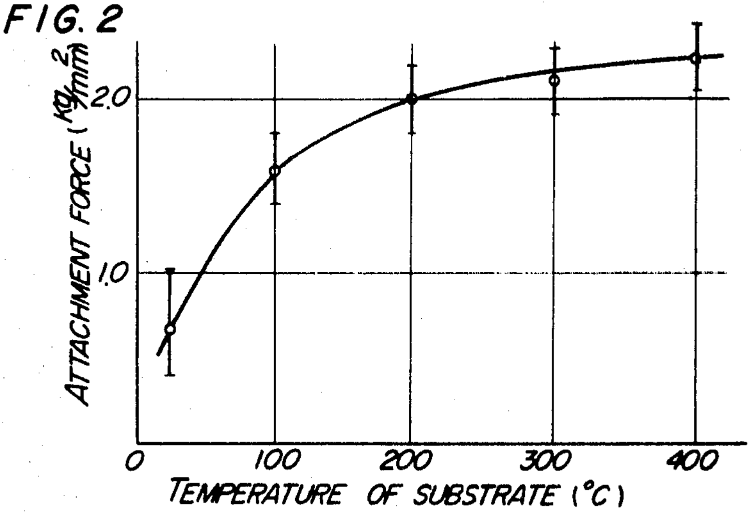

FIG. 2 shows the influence of the temperature of a silicon oxide film during evaporation on the force of adhesion of gold-chromium alloy film with the prescribed composition. It is clear that with a decrease of the substrate temperature particularly below 100° C. the force of adhesion becomes weaker. When the film is subjected to heat treatment below about 350° C. in vacuum for less than about 30 minutes, the force of adhesion increases with the temperature, but it does not reach the value obtained when the film is kept at the same temperature as the substrate during evaporation. The force of adhesion between the silicon oxide film and the usual aluminum film evaporated at 200° C. thereon (chromium and copper are evaporated further on the aluminum film and soldered) is about 1 kg./mm.$^2$ FIG. 2 shows that the adhesion of the gold-chromium alloy film is stronger. The gold-chromium film is adhered to the surface of a silicon substrate more weakly than on the silicon oxide film when the temperature of the substrate is below 100° C. while it is adhered more strongly when the temperature is above 200° C. The force of adhesion of a gold-chromium alloy film containing 5 percent by weight of chromium evaporated on silicon finished like a mirror surface is measured as follows.

| temperature of substrate during evaporation (τ) | force of adhesion (Kg./mm.$^2$) |
|---|---|
| 50 | 0.5—0.8 |
| 100 | 1.2—1.4 |
| 200 | 2.0—2.4 |
| 300 | 2.5—3.2 |
| 350 | 2.8—3.5 |
| 400 | 2.8—3.5 |

The experiment on the composition of the gold-chromium alloy film evaporated on the silicon oxide film and its relative difficulty of being soldered is made as follows. The alloy film (4,000 A. thickness) evaporated in the form of a circular pattern (1 mm. diameter) on the silicon oxide film is dipped in the fused solution of solder in a deoxidizing atmosphere. Then the film is pulled up, and the adhesion condition and the wetness of the solder are observed. The temperature of the fused solution is about 230° C. for the lead-tin eutectic solder and about 260° C. for the tin and the tin-silver eutectic solder. According to the results, in the region I of FIG. 1 the alloy film is immediately fused in the solder and vanishes. In the region II the film is partially fused and vanishes when the solution is stirred by the substrate. In the region III the wetness and the adhesion of solder are satisfactory. In the region IV the uniformity of adhesion is deteriorated and in the region V the adhesion is completely lost. Therefore in view of the easiness of solder adhesion the chromium content in the gold-chromium alloy film is most suitable in the range between 3 percent and 13 percent by weight.

The minimum thickness of the gold-chromium evaporation film influences the quality of solder adhesion. When the film thickness is less than 1,000 A. and the chromium content is small, the film is fused in the solder and vanishes. So special care is needed in the soldering process. The suitable thickness of the electrode film appears to be more than 1000 A. Practically no special care is necessary when the thickness is 2000 A. to 10,000 A. Since gold is expensive and occupies a non-negligible part in the manufacturing cost, it is not favorable to increase the film thickness over the above-mentioned value.

The relative difficulty of soldering of the gold-chromium alloy film evaporated on the silicon substrate is complicated as it depends on the finishing condition of the silicon surface and the temperature of the substrate. Generally, if no variation in color due to the alloy phenomenon between the silicon substrate and the gold-chromium alloy film is recognized, the relative difficulty of soldering of the alloy film is about the same as in the case of the silicon oxide film. However, if the variation in color is considerable, soldering becomes more difficult with a decrease in gold content, or an increase in chromium content, near the surface of the alloy film. The alloy phenomenon between the film and the substrate becomes remarkable when the temperature of a substrate exceeds a certain limit or when the surface of the silicon substrate is badly finished containing micro cracks or lattice defects. Furthermore as the film is thinner, the variation in color is large. For example, when the silicon surface is finished like a mirror surface with few defects, no variation in color due to the alloy phenomenon appears with 4,000 A. thickness and the film is easily soldered if the film is evaporated keeping the substrate much higher, e.g. 400° C., than the gold-silicon eutectic temperature (370° C.). On the other hand the silicon substrate which has undergone only a purification treatment after lapping is ready to form an alloy. For example, if the silicon substrate is processes by using Ø1000 alumina for lapping material and a glass plate for the lapping plate under the condition of a pressure of about 25 g./cm.$^2$ and a maximum speed of about 50 cm./sec., a color change by the alloy phenomenon is observed in the gold-chromium film when the temperature of the substrate during evaporation is higher than about 250° C.

The color inherently possessed by the film is obtained if evaporation is stopped when the film causes the alloy phenomenon. Then the temperature of silicon substrate is lowered below the gold-silicon eutectic temperature or 250° C. whether the silicon substrate is finished to have a mirror surface or processed by lapping. Thereafter the evaporation is again continued.

The force of adhesion of a gold-chromium film stacked on the film which has caused the alloy phenomenon is nearly equal to that of the evaporation film on the substrate having a mirror surface, i.e. 2.8 to 3.5 kg./mm.$^2$ The gold-chromium film evaporated at a temperature without causing an alloy suffers no color change and no difficulty in soldering regardless of the surface condition as long as the film is heated in vacuum or in inert gas for several tens of minutes below the gold-silicon eutectic temperature. However, if the film is heated for a long time above the eutectic temperature, an alloy is formed.

It was found through many experiments that the relative difficulty of etching of a gold-chromium alloy film treated by the conventional photolithographic treatment to form a desired pattern depends largely on the alloy composition. If the chromium content is less than 10 percent by weight, the conventional resist film and gold etching solution, i.e. solution of iodine and bromine system, can be used and the pattern has good reproducibility. Above 10 percent by weight of chromium content the solution should simultaneously erode both gold and chromium, i.e. aqua regia solution is necessary. Only minute caution is needed in the resist film and in the etching treatment. When the alloy phenomenon is seen between the gold-chromium alloy and the silicon surface without oxide film the conventional gold-silicon and silver solutions may be used alternately to remove the alloy. If the gold-chromium alloy film is evaporated under such a condition that the oxidation of chromium is considerable, much difficulty is encountered in etching. Therefore the residual gas pressure during evaporation should be kept lower than $5\times10^{15}$ torr.

The contact resistance between the gold-chromium alloy and silicon does not depend on the chromium content as long as the alloy composition lies in the range used in this invention. The relation between the contact resistance and the temperature of the substrate during the evaporation for the case of an N-type silicon wafer finished like a mirror surface and having an impurity concentration of $1\times10^{18}$ 1/cm.$^3$ is as shown in the following table. It is seen that the contact resistance increases with the temperature of the substrate.

| temperature of substrate (τ) | contact resistance ($\Omega$ cm.$^{12}$) |
|---|---|
| 100 | $5\times10^{2}$ |
| 200 | $8\times10^{3}$ |
| 300 | $3\times10^{4}$ |
| 350 | $2\times10^{4}$ |
| 400 | $2.5\times10^{14}$ |

This means that although no color change occurs in the film surface an alloy is formed in the boundary between silicon and the gold-chromium film.

Figure 3:
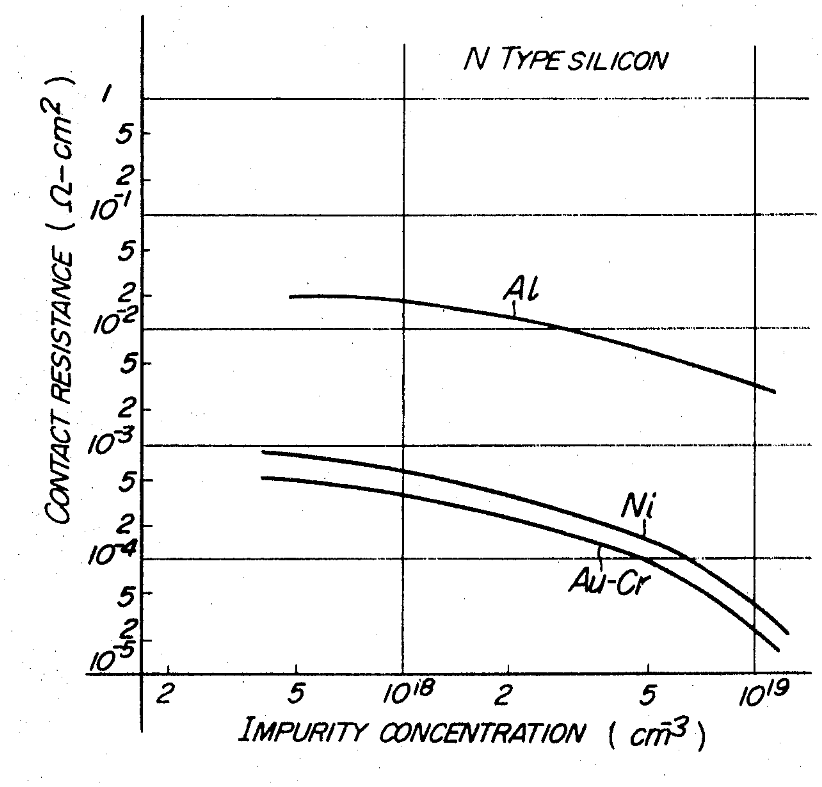
FIGS. 3 and 4 show the relation between the contact resistance of the electrode film obtained by this invention and the impurity concentration of the silicon substrate.
Figure 4:
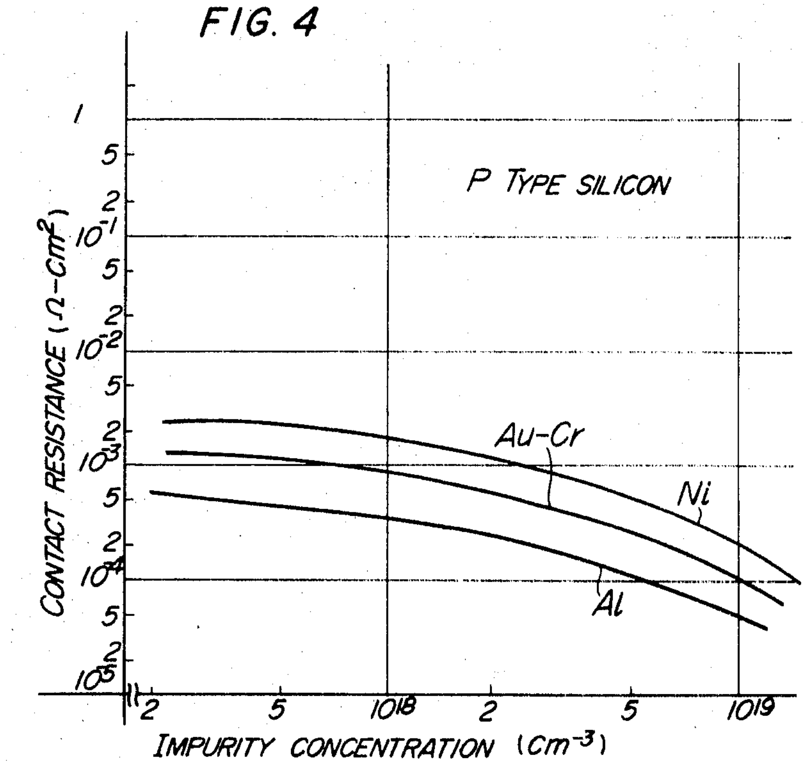

FIGS. 3 and 4 show the contact resistance of an electrode film of gold-chromium containing 5 percent by weight of chromium evaporated on a silicon wafer vs. the silicon impurity concentration. The silicon wafer has a mirror surface and is kept at 300° C. In these figures, the resistances of commonly used aluminum evaporation film and nickel film obtained by electroless plating are shown for comparison. It is clear that the gold-chromium alloy film surpasses these conventional films in regard to contact resistance.

As mentioned above in order to decrease the contact resistance between the gold-chromium film and silicon the temperature of the substrate should be made as high as possible during evaporation. But if the temperature is too high, the alloy phenomenon on the silicon surface becomes considerable. Indeed the contact resistance in the presence of the alloy phenomenon is lowest but soldering becomes difficult. In order to avoid this the film should be thicker than about 1 $\mu$ or another gold-chromium film should be stacked thereon at a low temperature. However, this requires a larger amount of gold and chromium material. Furthermore, when photolithography is applied to the film only on the silicon substrate, additional manhours are required to remove the alloy layer. No significant improvement is seen in the force of adhesion between the gold-chromium film and the silicon substrate even when the temperature of the substrate is high. Therefore, for empirical reasons the permissible maximum temperature of the substrate during evaporation should be about 430° C. even for a substrate with a mirror surface. When a lower contact resistance is needed for high resistivity silicon the gold-chromium alloy film must contain a small amount of either antimony or gallium (less than 1 percent by weight) depending on whether the silicon substrate is N-type or P-type, respectively. The film is evaporated in the same way as the aforementioned gold-chromium film. A higher content of antimony and gallium is of little use to decrease the contact resistance, it will only decrease the force of adhesion of the alloy film. This may be due to the much higher evaporation pressures of antimony and gallium, which introduce antimony and gallium in the alloy film mainly during the initial step of evaporation.

Figure 5:
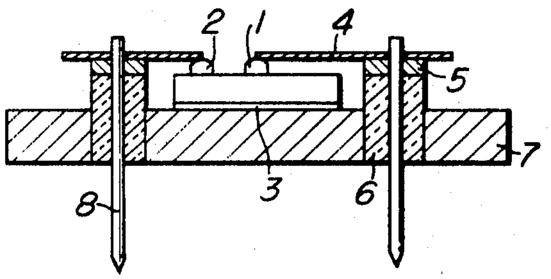
FIG. 5 shows an embodiment in which this invention is applied to a transistor.

Although explanation has been made of a silicon semiconductor device, this invention may be applied equally to germanium. Next, we will explain an embodiment where the invention is applied to an NPN power transistor (the collector-base voltage $V_{CBO}$=7.5 v., the emitter-base voltage $V_{EBO}$=4v., the collector current $I_C$=25a., the collector loss $P_C$=60w., the junction temperature $T_j$=150° C., the storage temperature $T_{stg}$=−55° C. to 150° C.). After the semiconductor slice is treated by a diffusion process the inventive gold-chromium alloy (5 percent chromium by weight) is evaporated to about 4,000 A. thickness as the emitter and base electrodes on the slice keeping the substrate temperature at 280° C. Patterns are formed on the electrodes by photolithography. Then the electrodes are dipped in the fused solution of lead-tin alloy solder (the solder temperature: 220° C. to 230° C. and the dipping time: 10 to 15 seconds) thereby to form solder layers on the electrode patterns. The bottom surface of the slice i.e. collector side is lapped by 01000 alumina powder and the gold-chromium alloy film is evaporated keeping the substrate at 200° C. After the scribing process the device is assembled in a soldered mount type as shown in FIG. 5. 1, 2 and 3 are emitter, base and collector electrodes to which this invention is applied. 4 and 5 are emitter and collector electrode plates applied by solder plating, 5 is insulating glass, and 6, 7 and 8 are a stem, emitter, and collector lead wires whose surfaces are treated by solder plating. Electrical characteristics and other properties of a transistor thus obtained have been found, through various tests, to be the same as or superior to those of the conventional transistor. Furthermore, it will be easily inferred that this invention can also be applied to a small power silicon transistor with its emitter and base electrodes formed by conventional wire bonding (wedge bond or nail head bond), thereby by far simplifying the fabrication processes.

What we claim is:

1. A semiconductor device having a metal electrode film making ohmic contact with a semiconductor substrate of said device, characterized in that said electrode film is formed by a gold-chromium alloy film containing 3 percent to 13 percent by weight of chromium, the remainder consisting substantially of gold.

2. A semiconductor device according to claim 1, characterized in that said semiconductor substrate is N-type silicon and that said electrode film is formed by a gold-chromium alloy film containing 3 percent to 13 percent by weight of chromium and less than 1 percent by weight of antimony, the remainder consisting substantially of gold.

3. A semiconductor device according to claim 1, characterized in that said semiconductor substrate is P-type silicon and that said electrode film is formed by a gold-chromium alloy film containing 3 percent to 13 percent by weight of chromium and less than 1 percent by weight of gallium, the remainder consisting substantially of gold.

4. A semiconductor device according to claim 1, wherein a solder layer is applied to said gold-chromium alloy film.

5. A semiconductor device according to claim 1 wherein the thickness of said gold-chromium alloy film exceeds 1,000 A.

6. A semiconductor device according to claim 1 wherein the thickness of said gold-chromium alloy film is between 2,000 A. and 10,000 A.